(12) United States Patent
Hsu et al.

(10) Patent No.: US 7,606,062 B2
(45) Date of Patent: Oct. 20, 2009

(54) ULTRA LOW VOLTAGE AND MINIMUM OPERATING VOLTAGE TOLERANT REGISTER FILE

(75) Inventors: Steven K. Hsu, Lake Oswego, OR (US); Amit Agarwal, Hillsboro, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 12/006,238

(22) Filed: Dec. 31, 2007

(65) Prior Publication Data

US 2009/0168483 A1 Jul. 2, 2009

(51) Int. Cl.
*G11C 11/40* (2006.01)

(52) U.S. Cl. .................. 365/154; 365/185.01; 365/190; 365/230.05

(58) Field of Classification Search .................. 365/156
See application file for complete search history.

(56) References Cited

U.S. PATENT DOCUMENTS

| | | | | |
|---|---|---|---|---|
| 4,933,899 | A | * | 6/1990 | Gibbs .......................... 365/177 |
| 5,239,501 | A | * | 8/1993 | Matsui et al. ................ 365/154 |
| 7,345,909 | B2 | * | 3/2008 | Chang et al. ................. 365/154 |
| 7,471,544 | B2 | * | 12/2008 | Nakazato et al. ............ 365/154 |

* cited by examiner

*Primary Examiner*—Tan T. Nguyen
(74) *Attorney, Agent, or Firm*—Caven & Aghevli LLC

(57) ABSTRACT

Methods and apparatus relating ultra-low voltage memory bit cells are described. In an embodiment, an ultra-low voltage memory device is provided using redundant paths to data storage nodes controlled by complementary write word lines. Other embodiments are also described.

15 Claims, 3 Drawing Sheets

ULTRA LOW VOLTAGE AND MINIMUM OPERATING VOLTAGE TOLERANT REGISTER FILE

FIELD

The subject matter described herein generally relates integrated circuits. In one embodiment, some of the techniques described herein may be utilized to reduce the minimum voltage required to operate a memory circuit.

BACKGROUND

One of the primary design challenges for today's high-performance multi-core processors is improving power efficiency. At the same time, these same designs may need to meet higher performance targets. One way to reduce power consumption and improve power efficiency in such designs may be to lower the supply voltage. However, lowering the supply voltage of a processor may be constrained by minimum operating voltage (min-Vcc) required to maintain on-chip storage elements operational.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some of the embodiments discussed herein may utilize two separate paths to write data into a memory bit cell. In an embodiment, an ultra-low voltage memory device is provided using redundant paths to data storage nodes which may be controlled by complementary write word lines. In some embodiments, the bit cell designs discussed herein may be utilized in register files of processors, such as discussed with reference to the figures herein.

Figure 1:
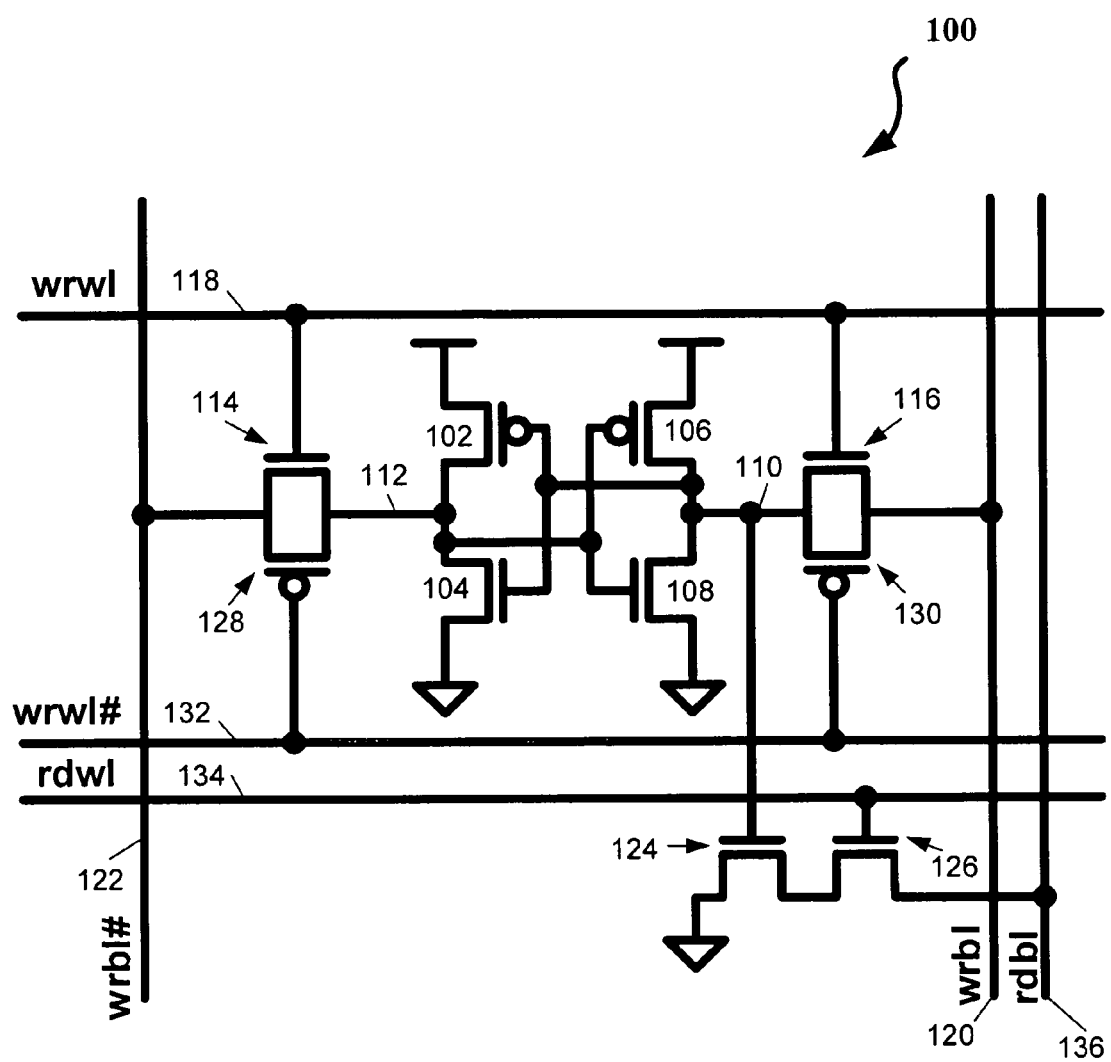
FIG. 1 illustrates a circuit diagram of a memory bit cell with dual-ended transmission gate write circuitry for ultra-low voltage operation in accordance with an embodiment of the invention.

FIG. 1 illustrates a circuit diagram of a memory bit cell 100 with dual-ended transmission gate write circuitry for ultra-low voltage operation in accordance with an embodiment of the invention. In some embodiments, the bit cell 100 may be used to enable ultra-low voltage operation of a data storage device, such as discussed further herein with reference to FIGS. 2-3, for example.

As shown in FIG. 1, transistor pair 102 and 104 (which may together form an inverter) and transistor pair 106 and 108 (which may together form an inverter) may form a circuit of two cross-coupled inverters that may be responsible for the state retention in a static register file cell (such as a static random access memory (SRAM) cell). Internal bit nodes 110 and 112 may be the storage nodes. The NMOS (N-Channel Metal Oxide Semiconductor) transistors 114 and 116 may be the access transistors and their gates may be coupled to a write word line 118. The drain terminals of the access transistors 116 and 114 may be coupled to the storage bit nodes 110 and its complement 112, respectively. The source terminals of 116 and 114 may be coupled to the write bit lines 120 and its complement 122. The NMOS transistors 124 and 126 may form a read transistor stack in an embodiment.

As illustrated in FIG. 1, the read word line 134 and the read bit line 136 are coupled to the read transistor stack. In some embodiments, decoupling the read circuitry may reduce (or even prevent) read stability issues. In particular, two PMOS (P-Channel Metal Oxide Semiconductor) devices 128 and 130 may be inserted in parallel with NMOS devices 114 and 116 to form full transmission gate access devices, respectively. The gates of transistors 128 and 130 may be controlled by the complement of write word line 118, 132. In some embodiments, adding these PMOS devices may improve the write margin. For example, consider the scenario where a '0' has to be written into the bit node 110. During the initial stage of the write operation, the transistor 106 may try to hold the bit node voltage at logic HIGH and the write circuit formed by the access transistor 116 and the inverter driving the write bit line 120 may have to over power transistor 106 if the '0' has to be successfully written into the bit node 110. However, contention from transistor 106 may be removed, since transistor 128 will write a strong "1" (Vcc) completely turning off transistor 106. As voltage is lowered, this memory cell may perform better than other designs that do not utilize similar transistors, in part, since it passes a strong "1" value. Even with variations, if transistor 106 is strong and transistor 116 is weak, the transistor 106 may have a Vgs=0 and no contention; therefore, the cell may be variation tolerant as the voltage is reduced. In some embodiments, providing two paths to write into the memory cell 100 may cause the cell to be variation tolerant, e.g., because of redundancy. In some embodiments, writing a value "1" into node bit may be performed by transistor 106 and transistor 130, while writing a "0" into the same node may be performed by transistor 108 and transistor 116. The redundancy (which may improve random variation in some implementations) and symmetry (which may improve systematic variations in some implementations) of embodiments discussed herein with respect to both NMOS and PMOS transistors may result in the variation tolerance and/or ultra low voltage operation.

Figure 2:
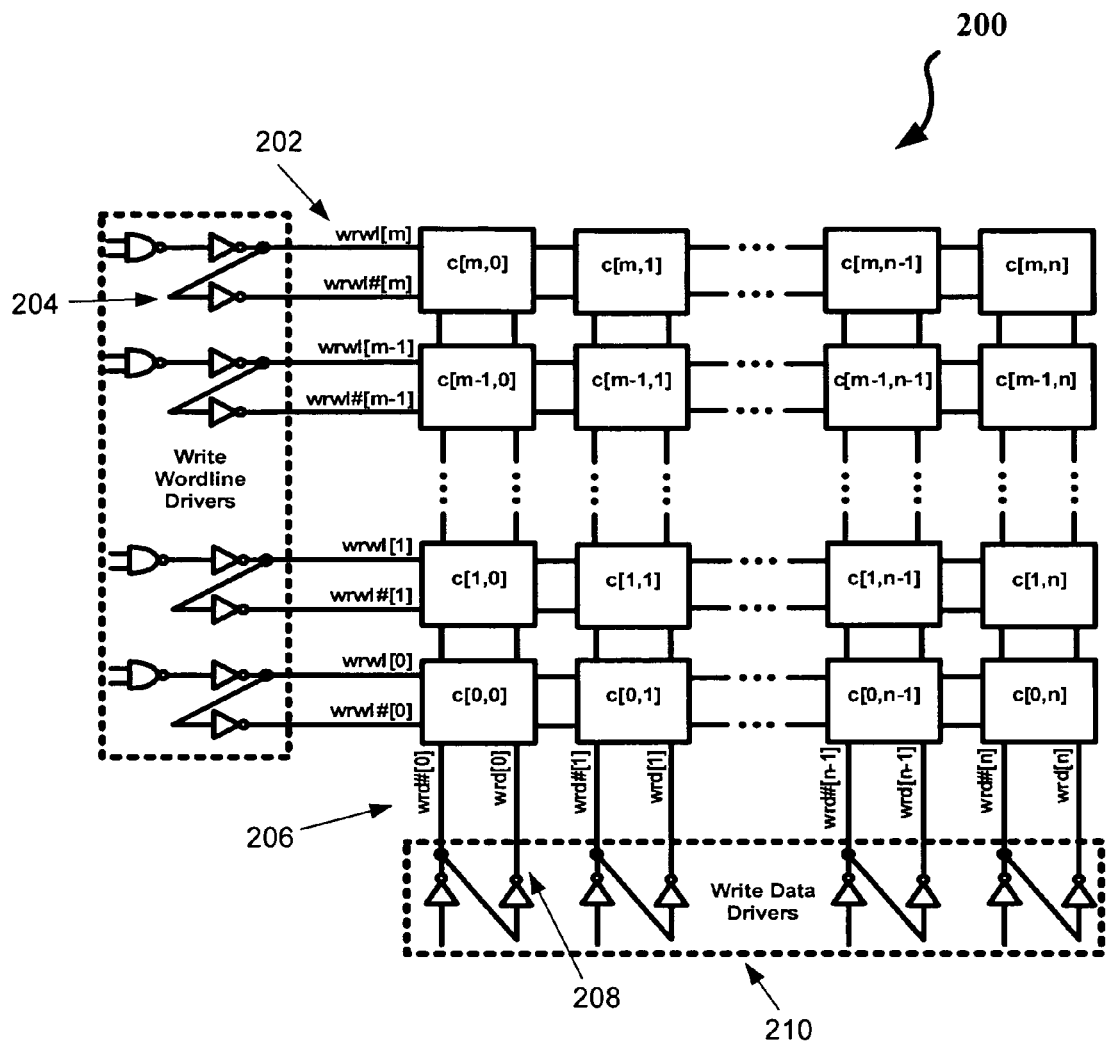
FIG. 2 illustrates a circuit diagram of a register file array architecture with the write peripheral circuits and wires for the ultra-low voltage register file cell, according to an embodiment.

FIG. 2 illustrates a circuit diagram of a register file array architecture 200 with the write peripheral circuits and wires for the ultra-low voltage register file cell, according to an embodiment. FIG. 2 in part shows an array of m+1 rows×n+1 column register file cells. The complementary write word line 202 may be generated by an inversion of word line 204 and stretches across the row direction for n+1 number of cells.

As shown in FIG. 2, the data write drivers 210 may stretch across the column direction, and complementary write data driver 206 may be generated by an inversion on write data driver 208. This may allow sharing of the drivers across m+1 number of cells. In some embodiments, the complementary word line 204 may be the same as or similar to the complementary word line 132 in FIG. 1. The shared word line and write driver inverters also may be local to each individual memory cell, e.g., allowing single-rail word lines and bit lines in some embodiments. Additionally, in some embodiments, the word line 202 may be the same as or similar to the word line 118 in FIG. 1. Also, in some embodiments, the complementary write data driver 206 may be the same as or similar to the complementary write bit line 122 in FIG. 1. Furthermore, in some embodiments, the write data driver 208 may be the same as or similar to the write bit line 120 in FIG. 1.

Figure 3:
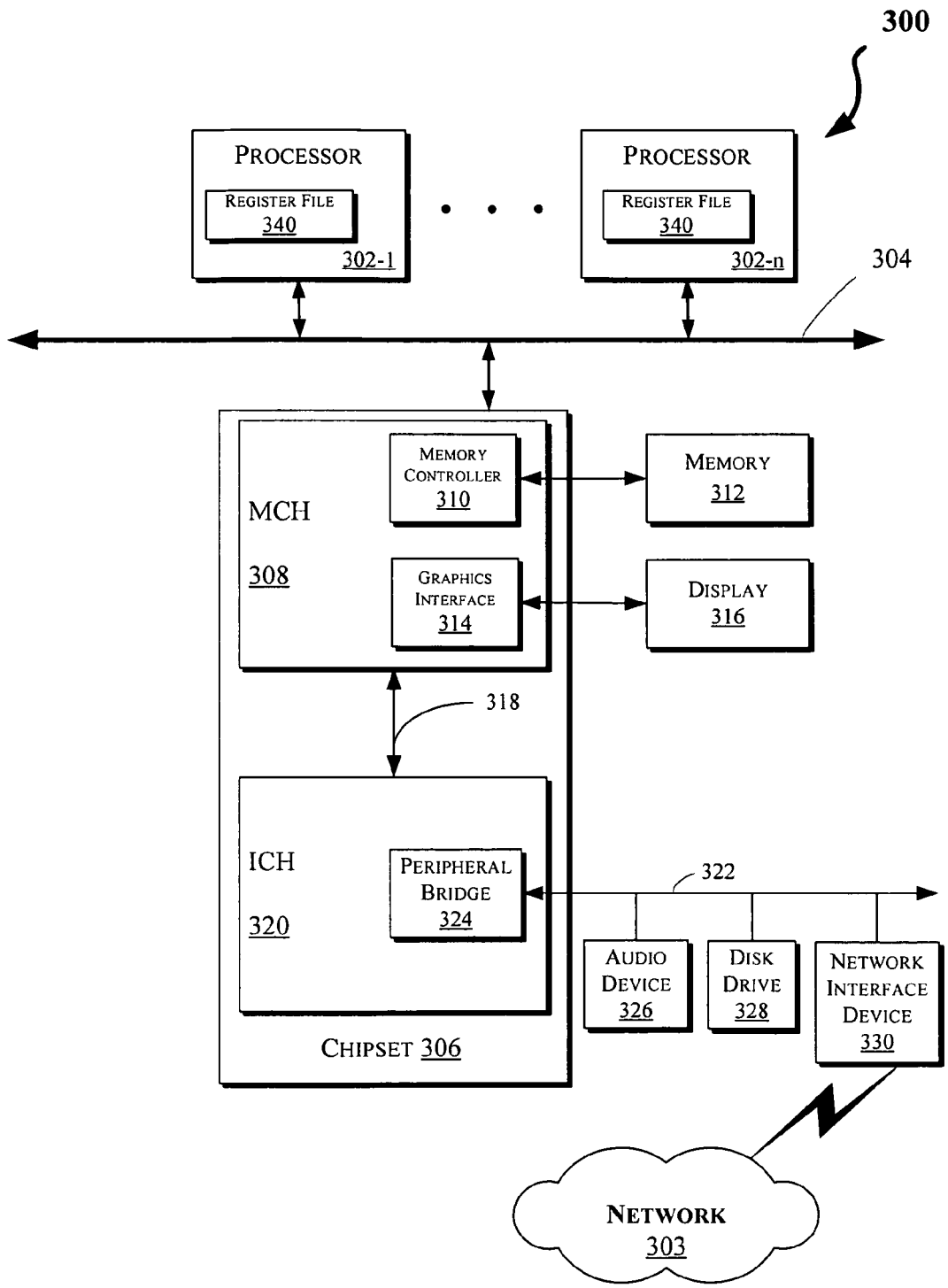
FIG. 3 illustrates a block diagram of a computing system, according to an embodiment.

FIG. 3 illustrates a block diagram of a computing system 300 in accordance with an embodiment of the invention. The computing system 300 may include one or more central processing unit(s) (CPUs) 302 or processors that communicate via an interconnection network (or bus) 304. The processors 302 may include a general purpose processor, a network processor (that processes data communicated over a computer network 303), or other types of a processor (including a reduced instruction set computer (RISC) processor or a complex instruction set computer (CISC)). Moreover, the processors 302 may have a single or multiple core design. The processors 302 with a multiple core design may integrate different types of processor cores on the same integrated circuit (IC) die. Also, the processors 302 with a multiple core design may be implemented as symmetrical or asymmetrical multiprocessors. In an embodiment, one or more of the components discussed with reference to FIG. 3 may utilize bit cells such as those discussed with reference to FIGS. 1-2 (such as the processors 302, which may include a register file 340, utilizing such bit cells).

A chipset 306 may also communicate with the interconnection network 304. The chipset 306 may include a memory control hub (MCH) 308. The MCH 308 may include a memory controller 310 that communicates with a memory 312. The memory 312 may store data, including sequences of instructions, that are executed by the CPU 302, or any other device included in the computing system 300. For example, operations may be coded into instructions (e.g., stored in the memory 312) and executed by processor(s) 302. In one embodiment of the invention, the memory 312 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 304, such as multiple CPUs and/or multiple system memories.

The MCH 308 may also include a graphics interface 314 that communicates with a display device 316. In one embodiment of the invention, the graphics interface 314 may communicate with the display device 316 via an accelerated graphics port (AGP). In an embodiment of the invention, the display 316 (such as a flat panel display) may communicate with the graphics interface 314 through, for example, a signal converter that translates a digital representation of an image stored in a storage device such as video memory or system memory into display signals that are interpreted and displayed by the display 316. The display signals produced by the display device may pass through various control devices before being interpreted by and subsequently displayed on the display 316.

A hub interface 318 may allow the MCH 308 and an input/output control hub (ICH) 320 to communicate. The ICH 320 may provide an interface to I/O device(s) that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303). Other devices may communicate via the bus 322. Also, various components (such as the network interface device 330) may communicate with the MCH 308 via a high speed (e.g., general purpose) I/O bus channel in some embodiments of the invention. In addition, the processor 302 and other components shown in FIG. 3 (including but not limited to the MCH 308, one or more components of the MCH 308, etc.) may be combined to form a single chip. Furthermore, a graphics accelerator may be included within the MCH 308 in other embodiments of the invention.

Furthermore, the computing system 300 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions). In an embodiment, components of the system 300 may be arranged in a point-to-point (PtP) configuration. For example, processors, memory, and/or input/output devices may be interconnected by a number of point-to-point interfaces.

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A processor comprising:
    a register file to store one or more bits of data, the register file to comprise a plurality of memory bit cells; and
    at least one of the plurality of memory bit cells to comprise:
        a first data storage element having a first transistor and a second transistor;
        a third transistor coupled between a write bit line and a bit node of the first data storage element; and
        a fourth transistor coupled between the write bit line and the bit node of the first data storage element,
        wherein the first and third transistors are to write a first value to the bit node and the second and fourth transistors are to write a second value to the bit node, wherein the first value and second value are complementary.

2. The processor of claim 1, wherein the at least one memory bit cell is to comprise:
    a second data storage element having a fifth transistor and a sixth transistor;
    a seventh transistor coupled between a complementary write bit line and a complementary bit node of the second data storage element; and
    a eighth transistor coupled between the complementary write bit line and the complementary bit node of the second data storage element,
    wherein the fifth and seventh transistors are to write the second value to the complementary bit node and the sixth and eighth transistors are to write the first value to the complementary bit node.

3. The processor of claim 2, wherein the first transistor and the second transistor form a first inverter.

4. The processor of claim 3, wherein the fifth transistor and the sixth transistor form a second inverter, wherein the first and second inverters are cross-coupled.

5. The processor of claim 1, further comprising a plurality of processor cores.

6. An apparatus comprising:
    a first transistor coupled to a write bit line, a write word line, and a bit node;
    a second transistor coupled to a complementary write bit line, the write word line, and a complementary bit node;
    a third transistor coupled to the write bit line, a complementary write word line, and the bit node, wherein the third transistor is coupled to the write bit line and the bit node in parallel with the first transistor; and
    a fourth transistor coupled to the complementary write bit line, the complementary write word line, and the complementary bit node, wherein the fourth transistor is coupled to the complementary write bit line and the complementary bit node in parallel with the second transistor.

7. The apparatus of claim 6, wherein the first and second transistors are NMOS (N-Channel Metal Oxide Semiconductor) transistors.

8. The apparatus of claim 6, wherein the third and fourth transistors are PMOS (P-Channel Metal Oxide Semiconductor) transistors.

9. The apparatus of claim 6, wherein the complementary write bit line is the complement of the write bit line.

10. The apparatus of claim 6, wherein the complementary write word line is the complement of the write word line.

11. The apparatus of claim 6, wherein the first transistor and the third transistor form a full transmission gate access device.

12. The apparatus of claim 6, wherein the second transistor and the fourth transistor form a full transmission gate access device.

13. The apparatus of claim 6, further comprising a plurality of the first, second, third, and fourth transistors, wherein the plurality is coupled by a shared write word line and complementary write word line.

14. The apparatus of claim 6, further comprising a plurality of the first, second, third, and fourth transistors, wherein the plurality is coupled by a shared write bit line and complementary write bit line.

15. The apparatus of claim 6, wherein complements of a write word line and a write bit line are to be generated locally to a memory cell to allow for single rail word lines and bit lines.

* * * * *